United States Patent
Yi et al.

(10) Patent No.: US 7,624,320 B2
(45) Date of Patent: Nov. 24, 2009

(54) APPARATUS FOR TESTING SYSTEM-ON-CHIP

(75) Inventors: Hyun-Bean Yi, Seongnam-si (KR); Jae-Hoon Song, Seoul (KR); Pil-Jae Min, Seoul (KR); Jin-Kyu Kim, Seoul (KR); Sung-Ju Park, Seongnam-si (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 302 days.

(21) Appl. No.: 11/727,572

(22) Filed: Mar. 27, 2007

(65) Prior Publication Data
US 2008/0022172 A1 Jan. 24, 2008

(30) Foreign Application Priority Data
Jul. 24, 2006 (KR) .................. 10-2006-0068912

(51) Int. Cl.
*G01R 31/28* (2006.01)

(52) U.S. Cl. ...................................... 714/727; 714/724
(58) Field of Classification Search ................. 714/724, 714/727, 729
See application file for complete search history.

(56) References Cited

U.S. PATENT DOCUMENTS

| 6,425,100 | B1 * | 7/2002 | Bhattacharya | 714/724 |
| 7,181,663 | B2 * | 2/2007 | Hildebrant | 714/726 |
| 7,237,161 | B2 * | 6/2007 | Volz | 714/724 |
| 2005/0240850 | A1 * | 10/2005 | Ohwada et al. | 714/738 |

* cited by examiner

*Primary Examiner*—James C Kerveros
(74) *Attorney, Agent, or Firm*—Birch, Stewart, Kolasch & Birch, LLP

(57) ABSTRACT

A system-on-chip (SoC) test apparatus is disclosed. The system-on-chip (SoC) testing apparatus reduces a test time due to a small amount of overhead in the case of testing an AMBA-based system-on-chip (SoC) using a TIC, an EBI, and a Test Harness, and maintains AMBA- or TIC- compatibility simultaneously while performing scan input/output operations.

11 Claims, 6 Drawing Sheets

US 7,624,320 B2

APPARATUS FOR TESTING SYSTEM-ON-CHIP

BACKGROUND OF THE INVENTION

1. Field of the Invention

The present invention relates to an apparatus for testing a system-on-chip (SoC), and more particularly to an apparatus for testing a system-on-chip (SoC) based on an Advanced Microcontroller Bus Architecture (AMBA).

2. Description of the Related Art

In recent times, with the increasing development of semiconductor architecture technology, a system-on-chip (SoC) in which an Intellectual Property (IP) system is configured in the form of a single chip.

The above-mentioned system-on-chip (SoC) design has generally used a reusable Intellectual Property IP, resulting in the reduction of a design time.

A system-on-chip (SoC) testing time required for improving reliability of the system-on-chip (SoC) is rapidly increasing in proportion to complexity of the system-on-chip (SoC).

In this case, the system-on-chip (SoC) testing costs are determined by a variety of factors, i.e., the size of a test pattern, an injection time of the test pattern, a test wrapper of a built-in core, a system-on-chip (SoC) Test Access Mechanism (TAM), and a test method.

The most important thing of the system-on-chip (SoC) design is to implement a bus system capable of allowing a plurality of IP cores placed on a single chip to communicate with each other. Recently, the most popular system-on-chip (SoC) system is an Advanced Microcontroller Bus Architecture (AMBA) manufactured by the Advanced RISC Machine (ARM) company.

In order to functionally test the IP cores using the above-mentioned AMBA, a Test Interface Controller (TIC), an External Bus Interface (EBI), and a Test Harness, etc. have been used.

However, in order to inspect the presence or absence of a malfunction caused by a variety of physical defects by functionally testing the IP cores using the AMBA, the system-on-chip (SoC) has a relatively low malfunction inspection rate. In order to solve the above-mentioned problem, a variety of structural tests associated with either a BIST (Built In Self Test) or a scan test have been widely used.

A specific technique capable of maintaining TIC (Test Interface Controller) compatibility and performing the structural test has been proposed by C. Feige et al., who have Published a research paper entitled "Integration of the Scan-Test Method into an Architecture Specific Cote-test Approach" in Journal of Electronic Testing, Volume 14, pp. 125~131, July 1998, which is incorporated herein by reference.

However, the above-mentioned technique capable of maintaining the TIC compatibility simultaneously while performing the structural test can improve reliability of the AMBA-based system-on-chip (SoC) using the scan test, however, it cannot simultaneously perform the scan input/output functions, such that a test time unnecessarily increases.

In the meantime, a representative example of the above-mentioned technique capable of simultaneously performing the scan input/output functions has been proposed by C. Lin and H. Liang, who have Published a research paper entitled "Bus-Oriented DFT Design for Embedded Cores" in IEEE Asia-Pacific Conference, Volume 1, pp. 561~563, December 2004, which is incorporated herein by reference.

The above-mentioned technique capable of simultaneously performing the scan input/output functions has used some parts of address buses from the EBI (External Bus Interface) to the outside of the chip as a test response observation path, such that the scan input function and the scan output function are processed in parallel to each other.

However, the above-mentioned technique capable of simultaneously performing the scan input/output functions modifies the APB and the EBI into others, further includes but signals other than the AMBA to perform the test injection and the test response observation, and can be applied to only the testing of the ABP core having a Primary Input (PI) width of 32 bits or less and a Primary Output (PO) width of 26 bits or less.

SUMMARY OF THE INVENTION

Therefore, the present invention has been made in view of the above problems, and it is an object of the present invention to provide a system-on-chip (SoC) testing apparatus for reducing a test time due to a small amount of overhead in the case of testing an AMBA-based system-on-chip (SoC) using a TIC, an EBI, and a Test Harness, and maintaining AMBA- or TIC-compatibility simultaneously while performing scan input/output operations.

In accordance with one aspect of the present invention, the above and other objects can be accomplished by a system-on-chip (SoC) test apparatus including a plurality of Intellectual Property (IP) cores, the apparatus comprising: a Test Interface Controller (TIC) module for receiving scan input data via a two-way data bus connected to an external part during a scan test mode, applying the scan input data to an Intellectual Property (IP) core via a bus, and creating an output data read signal; a signal creation module for receiving a scan test mode signal received for the scan test mode and the output data read signal, and creating a scan output read signal using the received scan test mode signal and the received output data read signal; an External Bus Interface (EBI) module for reading scan output data from the IP core according to the scan output read signal, and outputting the read scan output data; and a multiplexer for transmitting the scan output data and an output address to the external part according to the scan test mode signal.

Preferably, during a functional test mode, data received via the two-way data bus connected to the external part is applied to the TIC module, and data generated from the EBI module is outputted to the external part via the two-way data bus connected to the external part.

Preferably, the apparatus further comprises: a test wrapper for preventing input/output (I/O) operations between the IP core and several peripheral IP cores from being generated, thereby performing a scan test according to the scan test mode signal.

Preferably, the test wrapper includes a plurality of scan chains, and the number of the scan chains is equal to or larger than a size of the bus.

Preferably, the apparatus further comprises: a bridge for delaying the scan data received from the TIC module via an Advanced High-performance Bus (AHB) when the IP core is determined to be an Advanced Peripheral Bus (APB) core connected to an Advanced Peripheral Bus (APB), and generating the delayed scan data as APB scan data, converting the APB output data received from the APB core into output data at intervals of a predetermined time, and outputting the converted result; an Advanced Peripheral Bus (APB) input multiplexer for selecting the scan data from among the scan data and the APB scan data, and applying the selected scan data to the APB core; and an Advanced Peripheral Bus (APB) output multiplexer for selecting the APB output data from among the APB output data and the output data according to the scan test mode signal, and transmitting the selected APB output data to the AHB.

In accordance with another aspect of the present invention, there is provided a system-on-chip (SoC) test apparatus including a plurality of Intellectual Property (IP) cores, the apparatus comprising: a Test Interface Controller (TIC) module for receiving scan input data via a two-way data bus connected to an external part during a scan test mode, applying the scan input data to an Intellectual Property (IP) core via a bus, and creating an output data read signal; a signal creation module for receiving a scan test mode signal received for the scan test mode and the output data read signal, and creating a scan output read signal using the received scan test mode signal and the received output data read signal; an External Bus Interface (EBI) module for reading scan output data from the IP core according to the scan output read signal, and outputting the read scan output data; a multiplexer for transmitting the scan output data and an output address to the external part according to the scan test mode signal; and a test wrapper for preventing input/output (I/O) operations between the IP core and several peripheral IP cores from being generated, thereby performing a scan test according to the scan test mode signal.

Preferably, the apparatus further comprises: a bridge for delaying the scan data received from the TIC module via an Advanced High-performance Bus (AHB) when the IP core is determined to be an Advanced Peripheral Bus (APB) core connected to an Advanced Peripheral Bus (APB), and generating the delayed scan data as APB scan data, converting the APB output data received from the APB core into output data at intervals of a predetermined time, and outputting the converted result; an Advanced Peripheral Bus (APB) input multiplexer for selecting the scan data from among the scan data and the APB scan data, and applying the selected scan data to the APB core; and an Advanced Peripheral Bus (APB) output multiplexer for selecting the APB output data from among the APB output data and the output data according to the scan test mode signal, and transmitting the selected APB output data to the AHB.

In accordance with yet another aspect of the present invention, there is provided a system-on-chip (SoC) test apparatus including a plurality of Intellectual Property (IP) cores, the apparatus comprising: a Test Interface Controller (TIC) module for receiving scan input data via a two-way data bus connected to an external part during a scan test mode, applying the scan input data to an Intellectual Property (IP) core via a bus, and creating an output data read signal; a signal creation module for receiving a scan test mode signal received for the scan test mode and the output data read signal, and creating a scan output read signal using the received scan test mode signal and the received output data read signal; an External Bus Interface (EBI) module for reading scan output data from the IP core according to the scan output read signal, and outputting the read scan output data; a multiplexer for transmitting the scan output data and an output address to the external part according to the scan test mode signal; a bridge for delaying the scan data received from the TIC module via an Advanced High-performance Bus (AHB) when the IP core is determined to be an Advanced Peripheral Bus (APB) core connected to an Advanced Peripheral Bus (APB), and generating the delayed scan data as APB scan data, converting the APB output data received from the APB core into output data at intervals of a predetermined time, and outputting the converted result; an Advanced Peripheral Bus (APB) input multiplexer for selecting the scan data from among the scan data and the APB scan data, and applying the selected scan data to the APB core; and an Advanced Peripheral Bus (APB) output multiplexer for selecting the APB output data from among the APB output data and the output data according to the scan test mode signal, and transmitting the selected APB output data to the AHB.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
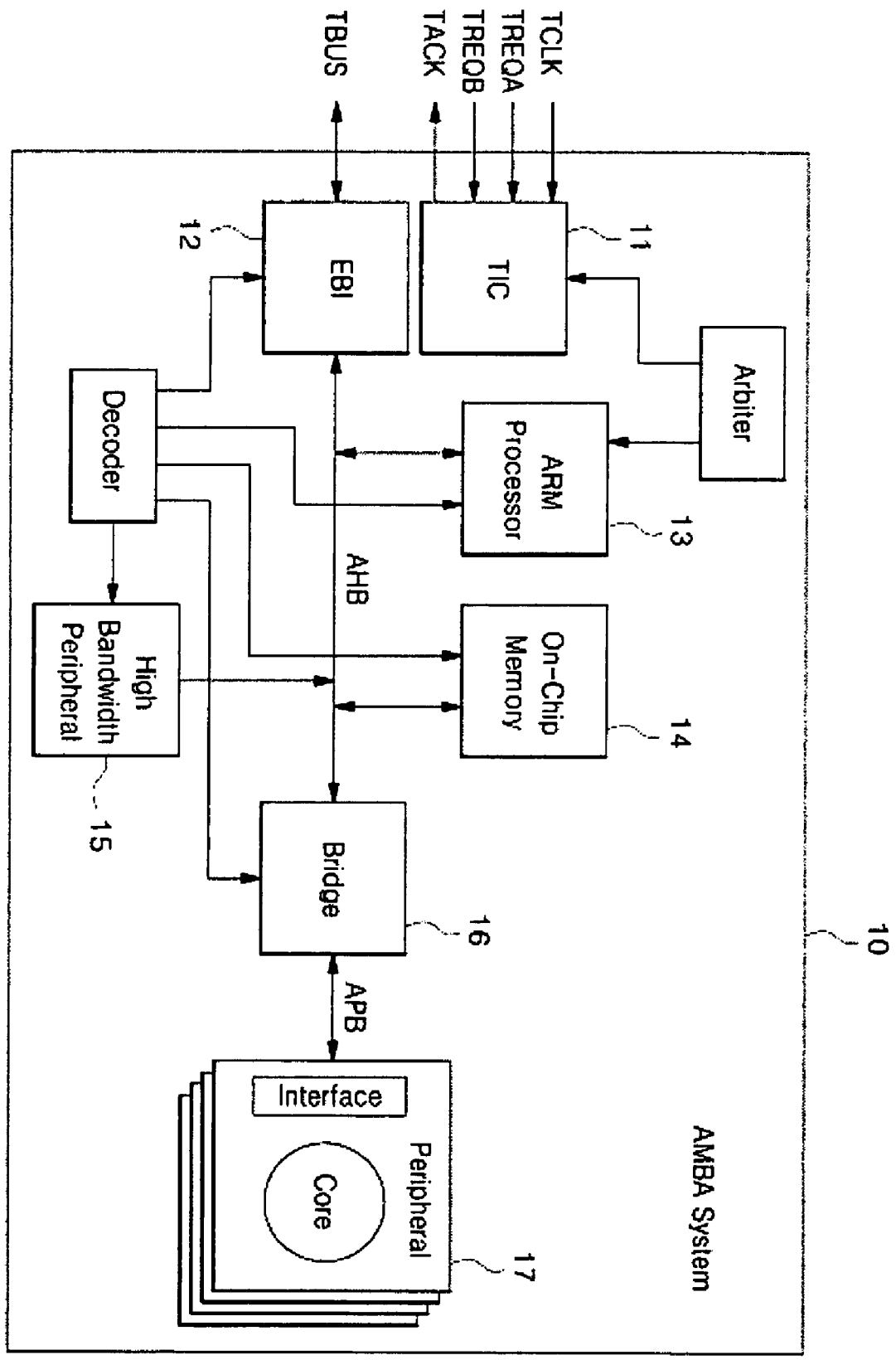
FIG. 1 is a block diagram illustrating a general AMBA system.

Now, preferred embodiments of the present invention will be described in detail with reference to the annexed drawings. In the drawings, the same or similar elements are denoted by the same reference numerals even though they are depicted in different drawings. In the following description, a detailed description of known functions and configurations incorporated herein will be omitted when it may make the subject matter of the present invention rather unclear.

A system-on-chip (SoC) testing device according to the present invention will hereinafter be described with reference to the annexed drawings.

FIG. 1 is a block diagram illustrating a general AMBA system.

Referring to FIG. 1, the AMBA system 10 includes an Advanced High-Performance Bus (AHB) and an Advanced Peripheral Bus (APB).

The AHB is designed for high-speed data communication, and is connected to interconnection of high-performance modules such as microprocessors. The APB is used for an interface of devices having a low transfer rate. An AHB-to-APB bridge 16 is required for a connection between the AHB and the APB.

In other words, the AHB-to-APB bridge 16 interfaces data communication between a high-speed device and a low-speed device.

In the meantime, a system-on-chip (SoC) based on the ARM processor includes a variety of IPs and dedicated modules, uses high-speed IP cores 13, 14, and 15 designed for the AHB bus of the AMBA system or a low-speed IP core 17 designed for the APB bus, such that a design time is reduced and the system reliability increases.

The TIC 11 acts as an interface controller for a functional test of the AMBA system.

In more detail, the TIC 11 is used as an AHB master during the functional test, and performs a Read/Write transaction of the basic AMBA system.

The EBI 12 uses a corresponding external bus as a test bus of the AMBA system 10, such that an additional area caused by an additional TAM can be reduced.

In the case of the test mode under the AMBA specification, a test harness for isolation, controllability, and observability of target IP cores (See reference numbers 13, 14, 15, and 17 of FIG. 1) is defined in the test mode.

Figure 2:
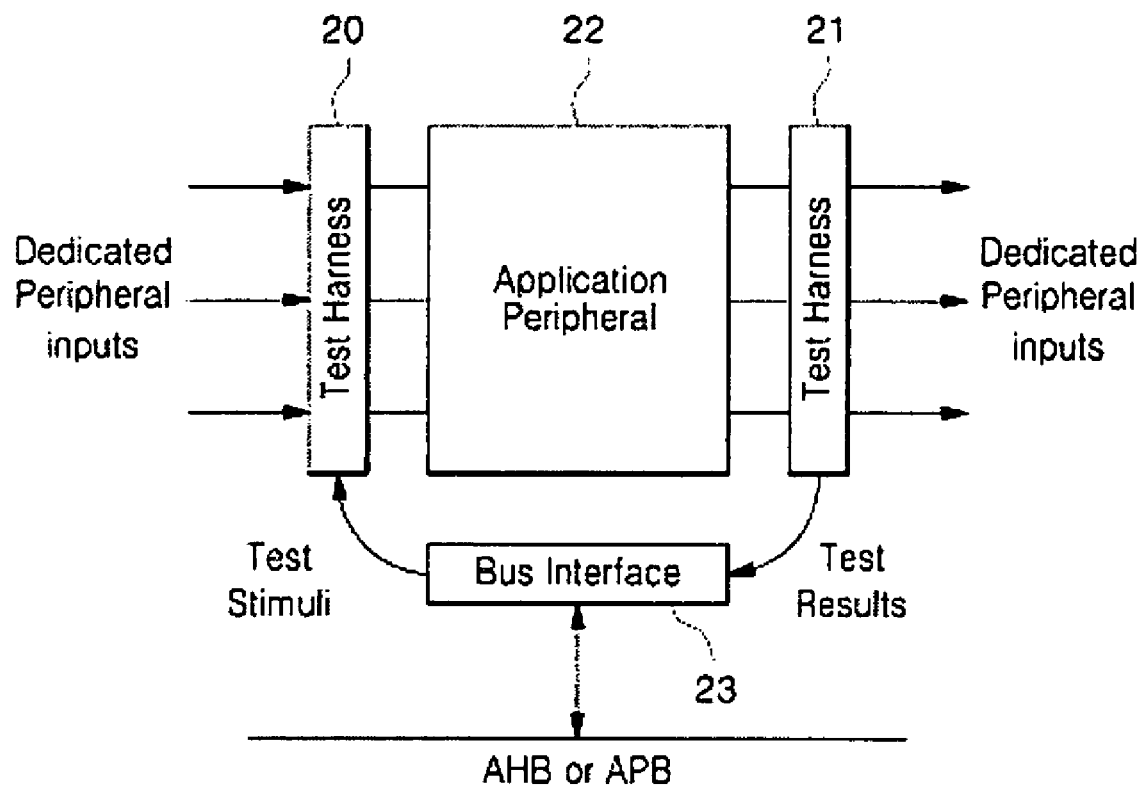
FIG. 2 is a circuit diagram illustrating a connection between a test harness proposed by an AMBA specification and a core according to the present invention.

A connection relationship between the above-mentioned test harness and the IP cores is depicted in FIG. 2.

FIG. 2 is a circuit diagram illustrating a connection between a test harness proposed by an AMBA specification and a core according to the present invention.

Referring to FIG. 2, the test harnesses 20 and 21 can be configured to be appropriate for input/output (I/O) and test strategies of the IP core 22, such that they can access non-AMBA I/O (Input/output) system.

In other words, the first test harness 20 receives a test pattern (also called test stimuli) from the AHB or the APB via the bus interface 23, and applies the received test stimuli to the IP core 22. The second test harness 21 receives information of test results of the test stimuli from the IP core 22 via the bus interface 23, and outputs the received test result information to the AHB or the APB of FIG. 1.

The system-on-chip (SoC) testing device according to the present invention includes a TIC, an EBI, and a Scan Test Wrapper (STW).

Figure 3:
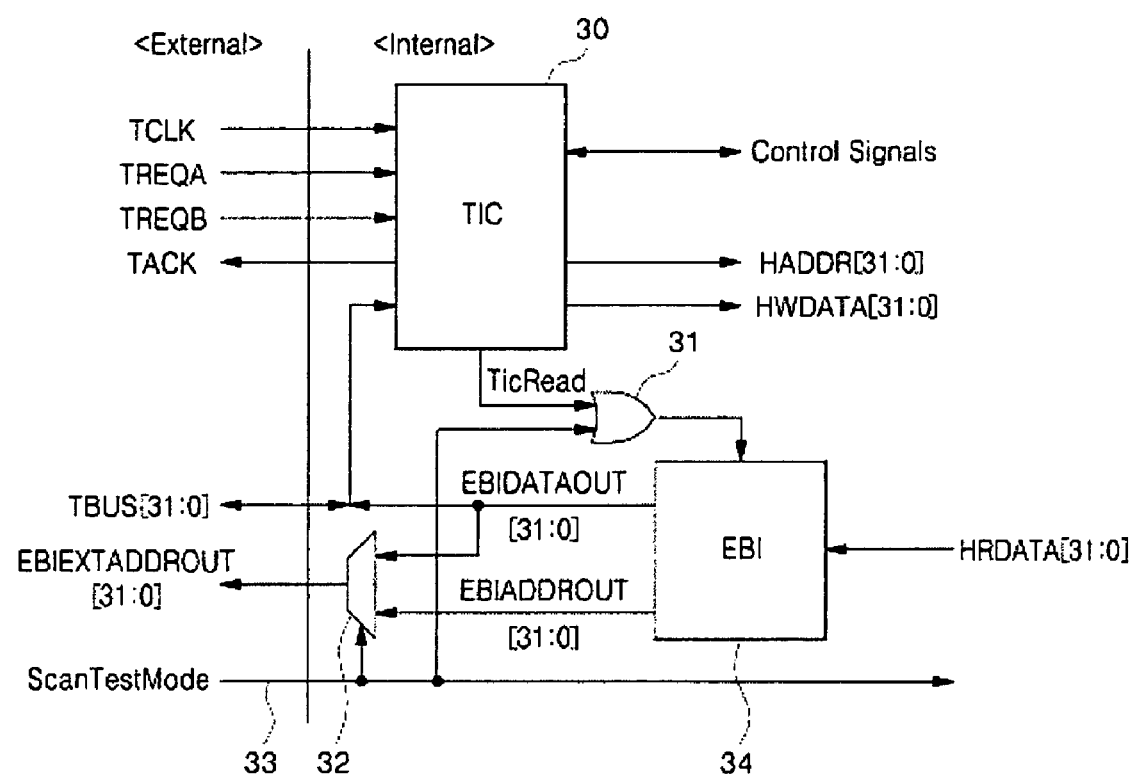
FIG. 3 is a circuit diagram illustrating a connection between the TIC and the EBI according to the present invention.

FIG. 3 is a circuit diagram illustrating a connection between the TIC and the EBI according to the present invention.

Referring to FIG. 3, the TIC module 30 is indicative of a TIC module manufactured by the ARM company to easily separate test paths from each other.

In order to distinguish the functional test from the scan test, the TIC module 30 further includes a scan test mode (ScanTestMode) pin 33.

In this case, if the value of 0 is applied to the scan test mode (ScanTestMode) pin 33, the functional test is performed. If the value of 1 is applied to the scan test mode (ScanTestMode) pin 33, the scan test mode for the scan test is performed.

Operations of individual components during the functional test mode established when the value of 0 is applied to the scan test mode (ScanTestMode) pin 33 will hereinafter be described in detail. Next, operations of individual components during the scan test mode established when the value of 1 is applied to the scan test mode (ScanTestMode) pin 33 will also be described.

When the functional test mode is executed, the TIC module 30 transmits addresses and data received from the TBUS line to the test target core (not shown) via the HADDR and HWDATA lines of the AHB, generates a TicRead signal to read scan output data received from the test target core, and transmits the TicRead signal to the OR gate 31.

The EBI module 34 reads data of the HRDATA line from the test target core according to the TicRead signal received from the OR gate 31, and outputs the test result via the TBUS line.

In the meantime, if the value of 1 is applied to the scan test mode (ScanTestMode) pin 33 under the functional test mode, the function test mode is transitioned to the scan test mode.

After the function test mode is transitioned to the scan test mode, the TIC module 30 receives scan input data from an external part via the TBUS line, transmits the received scan input data to the test target core, generates the TicRead signal, and transmits the TicRead signal to the OR gate 31.

If the TicRead signal is transmitted from the TIC module 30 to the OR gate 31 on the condition that the OR gate 31 receives the value of 1 via the scan test mode (ScanTestMode) pin 33, the OR gate 31 transmits the TicRead signal to the EBI module 34 using a logic OR operation.

The EBI module 34 receives scan output data from the test target core via the HRDATA line of the AHB upon receiving the TicRead signal from the OR gate 31, and transmits output data (EBIDATAOUP) and an output address (EBIADDROUT) to the multiplexer 32.

If the value of 1 is applied to the multiplexer 32 via the scan test mode (ScanTestMode) pin 33, i.e., if a current mode is determined to be the scan test mode, the multiplexer 32 outputs the scan output value of the output data (EBIDATAOUT) to the EBIEXTADDROUT line. Otherwise, if the value of 0 is applied to the multiplexer 32 via the scan test mode (ScanTestMode) pin 33, i.e., if a current mode is determined to be the functional test mode, the multiplexer 32 transmits the output address value (EBIADDROUT) to the ENIEXTADDROUT line.

As described above, during the scan test mode (ScanTestMode) established when the value of 1 is applied to the scan test mode (ScanTestMode) pin 33, the TIC module 30 and the EBI module 34 maintain a predetermined path "HRDATA (Data from Test Target Core)→EBIDATAOUT (Output Data)→EBIEXTADDROUT (External Output Address)".

As a result, it can be recognized that the TIC module 30 is used as a test input path, and the EBI module 34 is used as only the test output path.

Therefore, the scan output operation is automatically executed during the scan input period, such that the scan input function and the scan output function can be processed in parallel to each other without using a Read Transaction for the scan output.

Figure 4:
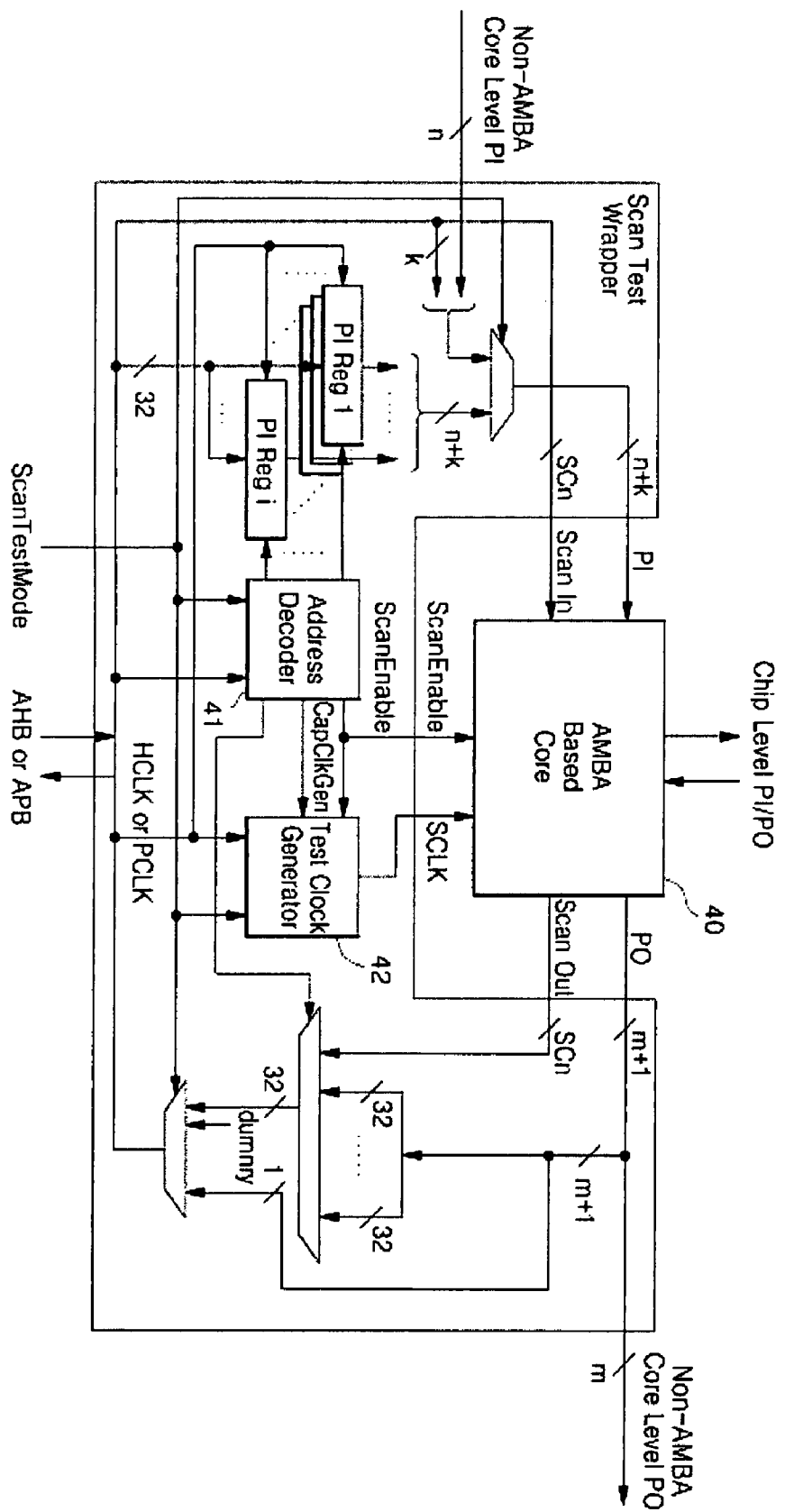
FIG. 4 is a circuit diagram illustrating a test wrapper according to the present invention.

FIG. 4 is a circuit diagram illustrating a test wrapper according to the present invention.

Referring to FIG. 4, the test wrapper includes a plurality of PI registers, an address decoder 41, a test clock generator 42, and a multiplexer.

In this case, the number of scan chains is limited to a data-bus size of 32 bits or less, such that there is no need to use an additional register for the scan input.

The PI/PO unit is classified into a chip-level PI/PO and a core-level PI/PO. The core-level PI/PO can be classified into an AMBA PI/PO (i.e., data bus, address bus, and control signals) and a NON-AMBA I/O.

The chip-level PI/PO may directly apply a test pattern (i.e., test stimuli) to the core 40 via an Automatic Test Equipment (ATE), such that it may observe the test pattern. The core-level PI/PO can be accessed by the test wrapper shown in FIG. 4.

In this case, it should be noted that the core-level PI/PO width of most AMBA-based cores is set to 32 bits or more.

The core-level PI must be applied to the core 40 at one time, and must be maintained during a predetermined period of time, such that a temporary register is required. The core-level PI is latched to the output of the core 40, and its data can be read by being addressed in 32-bit units, such that there is no need to use an additional register.

The address decoder 41 decodes the address received from the TIC module, selects individual registers contained in the test wrapper, establishes a test path, and creates a scan enable signal (ScanEnable) and a CapClkGen signal. The CapClkGen signal informs the test clock generator of a capture clock creation point.

The test clock generator 42 transmits a shift clock signal (SCLK) to the core via the clock gating logic according to the scan enable signal (ScanEnable).

Figure 5:
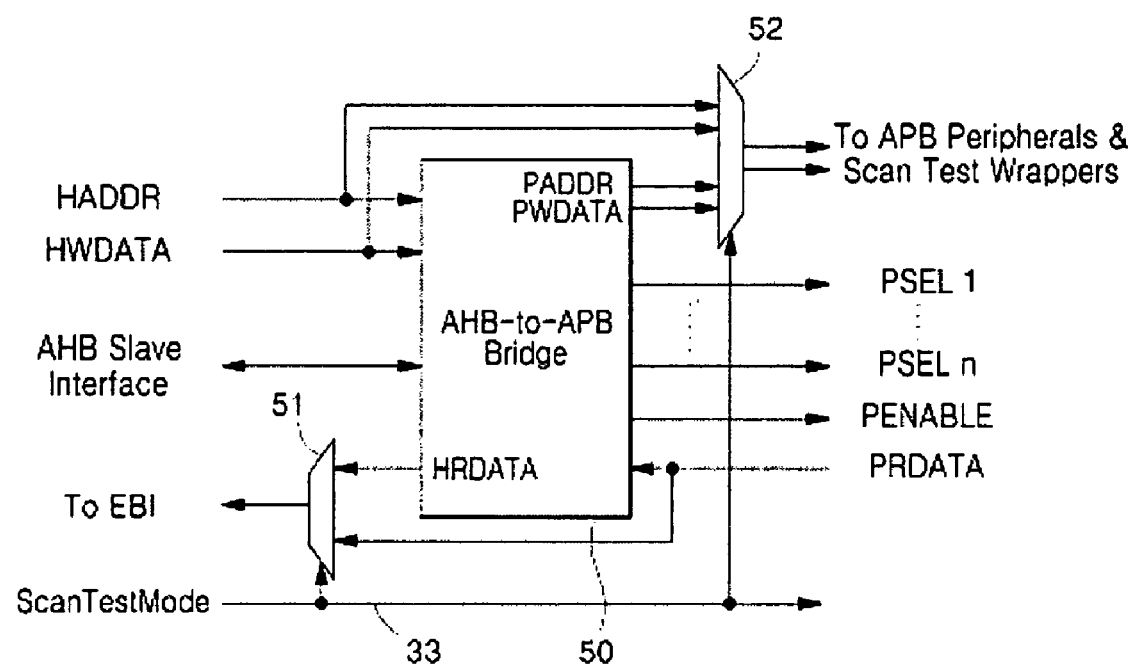
FIG. 5 is a circuit diagram illustrating a bridge according to the present invention.

FIG. 5 is a circuit diagram illustrating a bridge according to the present invention.

Referring to FIG. 5, if the value of 1 is applied to the scan test mode (ScanTestMode) pin 33, i.e., if the scan test mode is provided, a first multiplexer 52 selects an address and data received from the AHB, and transmits the selected address and data to either the cores (APB Peripherals) connected to the APB or the scan test wrappers.

Otherwise, if the value of 1 is applied to the scan test mode (ScanTestMode) pin 33, i.e., if the scan test mode is provided, a second multiplexer 51 selects data (PRDATA) received from the APB or data (HRDATA) received from the bridge, and transmits the selected data (PRDATA and HRDATA) to the EBI module connected to the AHB.

Therefore, when the TIC module indicative of the AHB master attempts to conduct a Write Transaction for the core connected to the APB via the bridge 50 on the condition that the first multiplexer 52 and the second multiplexer 51 are not in use, data must be maintained during a time period of at least 2HCLKs.

In the case of performing the Read Transaction, one data can be received at intervals of the time of a minimum of 2HCLKs Therefore, if the scan test mode is provided via the scan test mode (ScanTestMode) pin as shown in FIG. 5, only the path is changed to another path by the first multiplexer 52 and the second multiplexer 51, such that HADDR data can be directly connected to the PADDR, HWDATA data can be directly connected to the PWDATA, and PRDATA data can be directly connected to the HRDATA, resulting in the prevention of a test time consumed by the bridge 50.

The PWDATA is applied to the APB peripherals and the STW (Scan Test Wrapper), and the HADATA is applied to the EBI.

Figure 6:
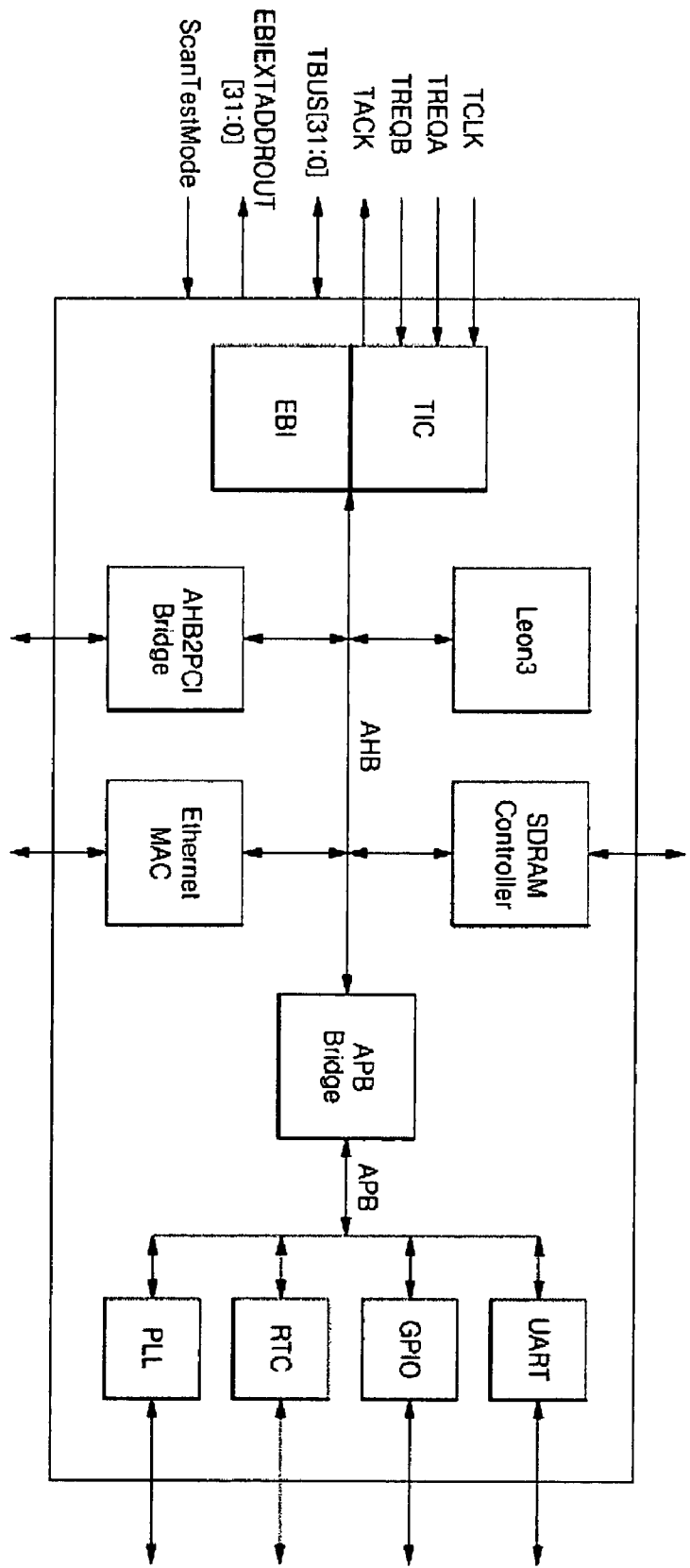
FIG. 6 is a circuit diagram illustrating an AMBA-based system-on-chip (SoC) according to the present invention.

FIG. 6 is a circuit diagram illustrating an AMBA-based system-on-chip (SoC) according to the present invention.

As can be seen from FIG. 6, the system-on-chip (SoC) test apparatus according to the present invention employs the AMBA system to estimate an area and performance of the SoC device.

32 scan chains are inserted into each of 7 cores other than the PLL using the Synopsys DFT complier, and a test pattern is created by the Synopsys TetraMAX.

The system-on-chip (SoC) test apparatus according to the present invention performs data composition using the Synopsys Design Complier, and acquires a timing simulation result using the Monitor Modelsim. In the case of comparing the area and performance of the system-on-chip (SoC) test apparatus according to the present invention with those of the conventional art which maintains the TIC compatibility and performs the structural test, the result of the comparison is as follows.

The scan test wrapper (STW) of FIG. 4 according to the present invention includes a register for only the PI, whereas the scan test wrapper (STW) of the conventional art includes a scan input register and a register for the PI, such that an area overhead of the ATAM can be reduced by about 6.11%.

The area overhead of the overall AMBA system reaches about 23.94%.

The following Table 1 shows a comparison result in test time between the present invention and the conventional art.

TABLE 1

| | Cores | Test Time (the number of clocks) | | ATAM Test Time Reduction (%) |
| --- | --- | --- | --- | --- |
| | | Existing Method | ATAM | |
| AHB | Leon3 Processor | 47478 | 31306 | 34.06 |
| | SDRAM Controller | 2652 | 1846 | 30.39 |
| | AHB2PCI Bridge | 3169 | 2066 | 34.62 |
| | Ethernet MAC | 55290 | 32540 | 41.15 |
| APB | UART | 19866 | 6026 | 69.67 |
| | GPIO | 468 | 201 | 57.95 |
| | RTC | 7800 | 2484 | 68.15 |
| | Total | 136714 | 76469 | 44.07 |

As can be seen from Table 1, in association with the AHB cores, the test time of the system-on-chip (SoC) test apparatus according to the present invention is reduced by the average of 35.06%. In association with the APB cores, the test time of the system-on-chip (SoC) test apparatus according to the present invention is reduced by the average of 64.96%. Therefore, it can be recognized that a total test time of the system-on-chip (SoC) test apparatus according to the present invention is reduced by about 44.07%.

The reason of the aforementioned test-time reduction is as follows. The system-on-chip (SoC) test apparatus according to the present invention performs the scan input function and the scan output function in parallel to each other, and establishes a test path via which the system-on-chip (SoC) test apparatus is directly connected to the APB cores without passing the AHB-to-APB bridge, such that a structure optimized for the test time can be configured.

As apparent from the above description, the system-on-chip (SoC) test device according to the present invention reduces a test time due to a small amount of overhead in the case of testing an AMBA-based system-on-chip (SoC) using the TIC, the EBI, and the Test Harness, and maintains AMBA- or TIC- compatibility simultaneously while performing scan input/output operations, resulting in the prevention of high testing costs caused by a high-priced test device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A system-on-chip (SoC) test apparatus including a plurality of Intellectual Property (IP) cores, the apparatus comprising:

a Test Interface Controller (TIC) module for receiving scan input data via a two-way data bus connected to an external part during a scan test mode, applying the scan input data to an Intellectual Property (IP) core via a bus, and creating an output data read signal;

a signal creation module for receiving a scan test mode signal received for the scan test mode and the output data read signal, and creating a scan output read signal using the received scan test mode signal and the received output data read signal;

an External Bus Interface (EBI) module for reading scan output data from the IP core according to the scan output read signal, and outputting the read scan output data;

a multiplexer for transmitting the scan output data and an output address to the external part according to the scan test mode signal;

a bridge for delaying the scan data received from the TIC module via an Advanced High-performance Bus (AHB) when the IP core is determined to be an Advanced Peripheral Bus (APB) core connected to an Advanced Peripheral Bus (APB), and generating the delayed scan data as APB scan data, converting the APB output data received from the APB core into output data at intervals of a predetermined time, and outputting the converted result;

an Advanced Peripheral Bus (APB) input multiplexer for selecting the scan data from among the scan data and the APB scan data, and applying the selected scan data to the APB core; and an Advanced Peripheral Bus (APB) output multiplexer for selecting the APB output data from among the APB output data and the output data according to the scan test mode signal, and transmitting the selected APB output data to the AHB.

2. The apparatus according to claim 1, wherein:

during a functional test mode, data received via the two-way data bus connected to the external part is applied to the TIC module, and data generated from the EBI module is outputted to the external part via the two-way data bus connected to the external part.

3. The apparatus according to claim 1, further comprising:

a test wrapper for preventing input/output (I/O) operations between the IP core and several peripheral IP cores from being generated, thereby performing a scan test according to the scan test mode signal.

4. The apparatus according to claim 3, wherein:

the test wrapper includes a plurality of scan chains, and the number of the scan chains is equal to or larger than a size of the bus.

5. A system-on-chip (SoC) test apparatus including a plurality of Intellectual Property (IP) cores, the apparatus comprising:

a Test Interface Controller (TIC) module for receiving scan input data via a two-way data bus connected to an external part during a scan test mode, applying the scan input data to an Intellectual Property (IP) core via a bus, and creating an output data read signal;

a signal creation module for receiving a scan test mode signal received for the scan test mode and the output data read signal, and creating a scan output read signal using the received scan test mode signal and the received output data read signal;

an External Bus Interface (EBI) module for reading scan output data from the IP core according to the scan output read signal, and outputting the read scan output data;

a multiplexer for transmitting the scan output data and an output address to the external part according to the scan test mode signal;

a test wrapper for preventing input/output (I/O) operations between the IP core and several peripheral IP cores from being generated, thereby performing a scan test according to the scan test mode signal;

a bridge for delaying the scan data received from the TIC module via an Advanced High-performance Bus (AHB) when the IP core is determined to be an Advanced Peripheral Bus (APB) core connected to an Advanced Peripheral Bus (APB), and generating the delayed scan data as APB scan data, converting the APB output data received from the APB core into output data at intervals of a predetermined time, and outputting the converted result;

an Advanced Peripheral Bus (APB) input multiplexer for selecting the scan data from among the scan data and the APB scan data, and applying the selected scan data to the APB core; and and Advanced Peripheral Bus (APB) output multiplexer for selecting the APB output data from among the APB output data and the output data according to the scan test mode signal, and transmitting the selected APB output data to the AHB.

6. The apparatus according to claim 5, wherein:

during a functional test mode, data received via the two-way data bus connected to the external part is applied to the TIC module, and data generated from the EBI module is outputted to the external part via the two-way data bus connected to the external part.

7. The apparatus according to claim 5, wherein:

the test wrapper includes a plurality of scan chains, and the number of the scan chains is equal to or larger than a size of the bus.

8. A system-on-chip (SoC) test apparatus including a plurality of Intellectual Property (IP) cores, the apparatus comprising:

a Test Interface Controller (TIC) module for receiving scan input data via a two-way data bus connected to an external part during a scan test mode, applying the scan input data to an Intellectual Property (IP) core via a bus, and creating an output data read signal;

a signal creation module for receiving a scan test mode signal received for the scan test mode and the output data read signal, and creating a scan output read signal using the received scan test mode signal and the received output data read signal;

an External Bus Interface (EBI) module for reading scan output data from the IP core according to the scan output read signal, and outputting the read scan output data;

a multiplexer for transmitting the scan output data and an output address to the external part according to the scan test mode signal;

a bridge for delaying the scan data received from the TIC module via an Advanced High-performance Bus (AHB) when the IP core is determined to be an Advanced Peripheral Bus (APB) core connected to an Advanced Peripheral Bus (APB), and generating the delayed scan data as APB scan data, converting the APB output data received from the APB core into output data at intervals of a predetermined time, and outputting the converted result;

an Advanced Peripheral Bus (APB) input multiplexer for selecting the scan data from among the scan data and the APB scan data, and applying the selected scan data to the APB core; and an Advanced Peripheral Bus (APB) output multiplexer for selecting the APB output data from among the APB output data and the output data according to the scan test mode signal, and transmitting the selected APB output data to the AHB.

9. The apparatus according to claim 8, wherein:

during a functional test mode, data received via the two-way data bus connected to the external part is applied to the TIC module, and data generated from the EBI module is outputted to the external part via the two-way data bus connected to the external part.

10. The apparatus according to claim 8, wherein:
the test wrapper includes a plurality of scan chains, and the number of the scan chains is equal to or larger than a size of the bus.

11. A system-on-chip (SoC) test apparatus including a plurality of Intellectual Property (IP) cores, the apparatus comprising:
- a Test Interface Controller (TIC) module for receiving scan input data via a two-way data bus connected to an external part during a scan test mode, applying the scan input data to an Intellectual Property (IP) core via a bus, and creating an output data read signal;
- a signal creation module for receiving a scan test mode signal received for the scan test mode and the output data read signal, and creating a scan output read signal using the received scan test mode signal and the received output data read signal;
- an External Bus Interface (EBI) module for reading scan output data from the IP core according to the scan output read signal, and outputting the read scan output data;
- a multiplexer for transmitting the scan output data and an output address to the external part according to the scan test mode signal;
- a bridge for delaying the scan data received from the TIC module via an Advanced High-performance Bus (AHB) when the IP core is determined to be an Advanced Peripheral Bus (APB) core connected to an Advanced Peripheral Bus (APB), and generating the delayed scan data as APB scan data, converting the APB output data received from the APB core into output data at intervals of a predetermined time, and outputting the converted result;
- an Advanced Peripheral Bus (APB) input multiplexer for selecting the scan data from among the scan data and the APB scan data, and applying the selected scan data to the APB core; and
- an Advanced Peripheral Bus (APB) output multiplexer for selecting the APB output data from among the APB output data and the output data according to the scan test mode signal, and transmitting the selected APB output data to the AHB,
- wherein during a functional test mode, data received via the two-way data bus connected to the external part is applied to the TIC module, and data generated from the EBI module is outputted to the external part via the two-way data bus connected to the external part, and
- the number of scan chains contained in the test wrapper is equal to or larger than a size of the bus.

* * * * *